US005736689A

United States Patent [19]

Van Hout et al.

[11] Patent Number: 5,736,689

[45] Date of Patent: Apr. 7, 1998

[54] AUDIO SPEAKER MOUNTING SYSTEM WITH IMPROVED MOUNTING AND SOUND ISOLATION FEATURES

[76] Inventors: James E. Van Hout, 676 Briarvale Dr., Auburn Hills, Mich. 48326; Zdzislaw J. Skorupa, 2400 N. Fairview La., Rochester Hills, Mich. 48306; Paul C. Pellerito, 257 Stock Rd., Metamora, Mich. 48455; Frank R. Piatt, 5147 Buckingham Pl.; Thomas D. Mihelich, 2068 Harned, both of Troy, Mich. 48098; Richard Kleinhoffer, 15805 Aspen, Macomb Twp., Mich. 48044

[21] Appl. No.: 646,741

[22] Filed: May 3, 1996

Related U.S. Application Data

[63] Continuation-in-part of Ser. No. 298,720, Aug. 31, 1994, abandoned.

[51] Int. Cl.[6] .................................................... H05K 5/00

[52] U.S. Cl. ........................................ 181/141; 181/150

[58] Field of Search .................................. 181/141, 150, 181/199; 381/86, 87, 88, 188, 205

[56] References Cited

U.S. PATENT DOCUMENTS

| | | | |
|---|---|---|---|
| 3,369,784 | 2/1968 | Whitney | 181/150 |
| 4,032,725 | 6/1977 | McGee | 181/150 |
| 4,056,165 | 11/1977 | Okamoto et al. | 181/141 |
| 4,152,544 | 5/1979 | Sanpei et al. | |
| 4,277,653 | 7/1981 | Paweizick | |
| 4,337,380 | 6/1982 | Tezuka et al. | 181/150 X |
| 4,550,796 | 11/1985 | Tomita | 181/141 |
| 4,733,748 | 3/1988 | Ponticelli, Jr. | |
| 4,790,407 | 12/1988 | Yamamoto et al. | |
| 4,853,966 | 8/1989 | Skrzycki | |
| 4,905,860 | 3/1990 | Kurihara et al. | |
| 4,974,698 | 12/1990 | Smith | |
| 4,993,510 | 2/1991 | Kato et al. | 181/141 |
| 5,048,089 | 9/1991 | Moore | |
| 5,532,437 | 7/1996 | Simplicean et al. | 181/150 |

*Primary Examiner*—Khanh Dang

[57] ABSTRACT

A system for mounting an audio speaker within an automobile door, in which a bridge is mounted on and extends from a door interior support panel, and has an integral platform spaced from the support panel and surrounding a speaker opening. The body of the audio speaker is received within the bridge speaker opening, and mounting flange tabs on the speaker radially project from the speaker body and are releasably secured to the bridge platform. An exterior trim panel has a lip that surrounds a speaker opening in the trim panel. The trim panel lip is removably secured to the platform radially outwardly of the speaker, such that the trim panel and the speaker are removably secured to the platform independently of each other. A grill is removably secured to the trim panel overlying and enclosing the speaker opening in trim panel, and thus covering both the bridge platform and the speaker.

16 Claims, 3 Drawing Sheets

AUDIO SPEAKER MOUNTING SYSTEM WITH IMPROVED MOUNTING AND SOUND ISOLATION FEATURES

This application is a continuation-in-part of application Ser. No. 08/298,720 filed Aug. 31, 1994 now abandoned.

The present invention is directed to audio speaker mounting systems, and more particularly to an improved system for mounting an audio speaker within an automobile door.

BACKGROUND AND OBJECTS OF THE INVENTION

There are three basic techniques currently employed for mounting an audio speaker within an automobile door. In the first conventional technique, the speaker is mounted directly to the sheet metal of the door inner panel, and then covered with a trim panel and grill. A compressed seal foam may be employed in an effort to form an acoustic seal between the speaker and the trim panel. Speaker service requires removal of the entire trim panel and grill assembly.

The second conventional technique of mounting a speaker within an automobile door is to attach the speaker to the trim panel and grill assembly prior to mounting the trim panel and grill assembly on the door. This technique thus requires a separate subassembly operation. Flexibility of the relatively large trim panel during handling can result in damage to the speaker prior to assembly to the door. When it is necessary to remove the trim panel to service other door interior components, the speaker must also be disconnected and disassembled from the door. Flexibility of the trim panel also results in unstable mounting of the speaker on the door and difficulty in obtaining an acoustic seal surrounding the speaker body.

The third conventional method of mounting a speaker to an automobile door is to attach the speaker to a grill, which in turn is removably attached to the trim panel. This technique thus also requires a separate subassembly operation, as well as removal and disconnection of the speaker and grill subassembly prior to removing the trim panel for door interior service. Flexibility of the trim panel also leads to instability of the speaker mounting arrangement and difficulty in obtaining a proper acoustic seal, as described above.

It is a general object of the present invention to provide an audio speaker mounting system of general utility, but which finds particular application in mounting a speaker to an automobile door, which addresses the aforementioned disadvantages of the prior art in terms of assemblability and serviceability of the mounting arrangement. A more specific object of the present invention is to provide an audio speaker mounting system that eliminates the necessity of subassembly of the speaker to either the trim panel or the grill, and in which the speaker and trim panel are removable for service independently of each other. A further object of the present invention is to provide a speaker mounting system of the described character that exhibits enhanced acoustic isolation of the speaker from the surrounding mounting structure.

SUMMARY OF THE INVENTION

A system for mounting an audio speaker in accordance with the present invention includes a bridge mounted on and extending from a support, and having an integral platform surrounding an interior cavity and spaced from the support. The body of an audio speaker is received within the bridge cavity, and mounting flange tabs that project radially from the speaker body are removably secured to the bridge platform. A trim panel overlies the support and is removably secured to the bridge radially outwardly of the speaker and independently of the speaker mounting tabs, such that the exterior trim panel and the speaker are removable from the bridge independently of each other. A grill is removably secured to the trim panel overlying the speaker and bridge platform.

In the preferred implementation of the invention for mounting an audio speaker within an automobile door, the bridge is mounted on and extends from a door interior support panel,and has an integral platform spaced from the support panel and surrounding a speaker opening or cavity on the bridge. The body of the audio speaker is received within the bridge speaker opening, and mounting flange tabs on the speaker radially project from the speaker body and are releasably secured to the bridge platform. An interior trim panel has a lip that surrounds a speaker opening in the trim panel. The trim panel lip is removably secured to the bridge platform radially outwardly of the speaker, such that the trim panel and the speaker are removably secured to the platform independently of each other. A grill is removably secured to the trim panel overlying and enclosing the speaker opening in the trim panel, and thus covering both the bridge platform and the speaker.

The improved speaker mounting system so described simplifies both assemblability and serviceability of the door. That is, the speaker and trim panel may be independently secured to the door at any convenient point in the assembly process. Any requirement for subassembly of the speaker to the grill or trim panel is eliminated. The arrangement of the present invention has the particular advantage when the speaker is mounted to the door before the trim panel that mishandled speaker fasteners do not become trapped within interior door cavities. In terms of serviceability, the speaker can be removed and replaced without removing the door trim panel. Likewise, the door trim panel can be removed for service to interior door components without removing or disconnecting the speaker. This arrangement not only protects the speaker from handling damage when other door components are being serviced, but also saves time and expense during the door service procedure. Furthermore, since the speaker is mounted independently of the door trim panel, improved seal integrity can be obtained for both the speaker and the trim panel, improving the bass response of the door speaker system. Structural rigidity and integrity of the speaker mounting arrangement reduces audio-induced rattling and resonance in neighboring door components.

In the preferred embodiments of the invention, the trim panel is affixed to the bridge on a ledge that is spaced from the platform on which the speaker is mounted. This helps isolate vibration of the speaker from the trim panel and overlying grill. Most preferably, a thin layer of foam rubber is disposed between the trim panel and the opposing bridge ledge surface for enhanced isolation between the bridge and the trim panel. The bridge is affixed by screws to the sheet metal support panel within the door. The screw openings in the sheet metal support panel lie within conical recesses, which facilitate alignment between the screws and openings during assembly, and thereby facilitate the assembly process. Studs on the platform register with openings in the sheet metal support panel to assist alignment during assembly, and thereby further facilitate the assembly operation.

BRIEF DESCRIPTION OF THE DRAWING

The invention, together with additional objects, features and advantages thereof, will be best understood from the following description, the appended claims and the accompanying drawing in which:

DETAILED DESCRIPTION OF PREFERRED EMBODIMENTS

Figure 1:
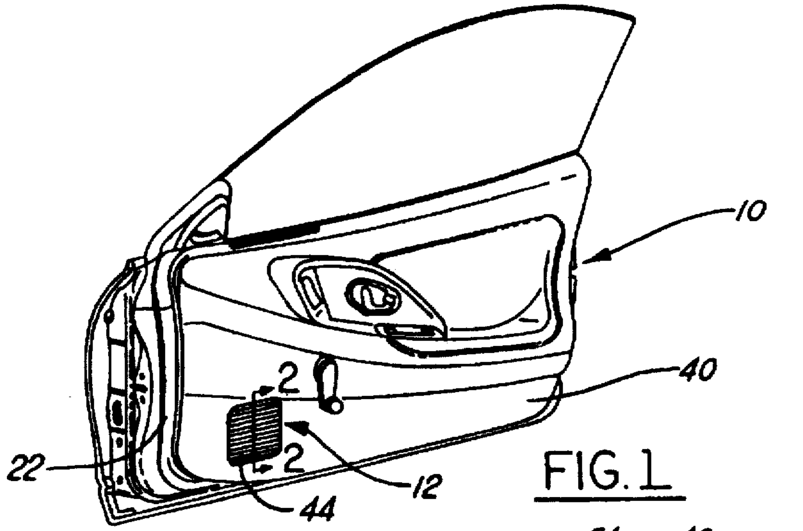
FIG. 1 is a perspective view of the interior portion of an automobile door.
Figure 2:
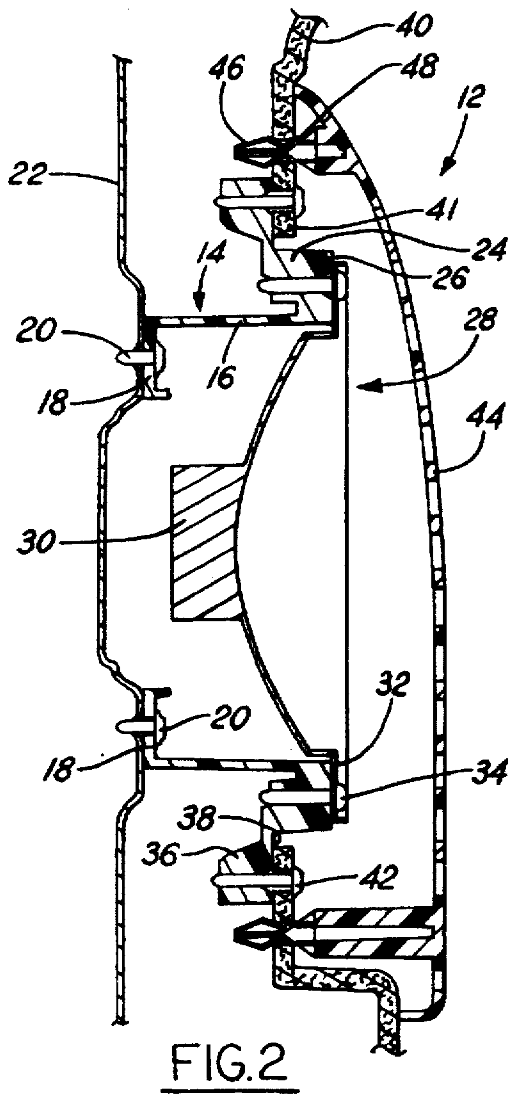
FIG. 2 is a fragmentary sectional view taken along the line 2—2 in FIG. 1 and illustrating one embodiment of an improved speaker mounting system in accordance with the present invention.

FIGS. 1 and 2 illustrate an automobile door 10 that features an improved speaker mounting system 12 in accordance with one presently preferred embodiment of the invention. A bridge bracket 14 has a circumferentially continuous wall 16 with an inwardly projecting end flange or array of tabs 18 secured by screws 20 to the sheet metal interior panel 22 of door 10. A circumferentially continuous platform 24 projects radially outwardly from the other end of wall 16, having a continuous flat axially facing surface 26. An audio speaker 28 has a body portion 30 (illustrated schematically in the drawings) received within the opening or cavity formed by platform 24 and wall 16. A mounting flange 32 has tabs that are secured by screws 34 to surface 26 of platform 24. The opposing flat surfaces of flange 32 and bridge 24 provide an improved acoustic seal between speaker 28 and bridge 14. Panel 22 and bridge wall 16 form an acoustic chamber that can be contoured to obtain desired sound characteristics.

Platform 24 has a radially outwardly extending circumferentially continuous recessed ledge 36. Bridge 14, including wall 16, mounting flange 18 and platform 24 with ledge 36, is preferably of integral monolithic or one-piece metal or molded plastic construction. Ledge 36 has a flat axially facing surface 38 parallel to but offset from surface 26. A door interior trim panel 40 has a speaker opening defined by a lip 41, which is releasably mounted by screws 42 against surface 38 of ledge 36. Flat surface engagement between panel lip 41 and ledge surface 38 provides a second acoustic seal between speaker 28 and the surrounding door components. Platform surfaces 26,38 are parallel to but displaced from each other, as shown in FIG. 2, to provide an added measure of acoustic isolation. A grill 44 has compressible fasteners 46 received within openings 48 in trim panel 40 radially outwardly of bridge 14, speaker 28 and mounting screws 42,34. Grill 44 thus overlies and covers the speaker and speaker mounting arrangement.

In assembly, bridge 14 is first secured to interior panel 22 by screws 20. Since speaker 28 and panel 40 are mounted on bridge 14 independently of each other, the speaker and trim panel may be assembled to the bridge in any sequence. With grill 44 first removed, trim panel 40 may be removed for door interior service without in any way removing or otherwise tampering with speaker 28. In the same way, speaker 28 may be serviced without removing panel 40. (Trim panel 40 is, of course, secured to door 10 at other locations around the periphery of the trim panel.)

Figure 3:
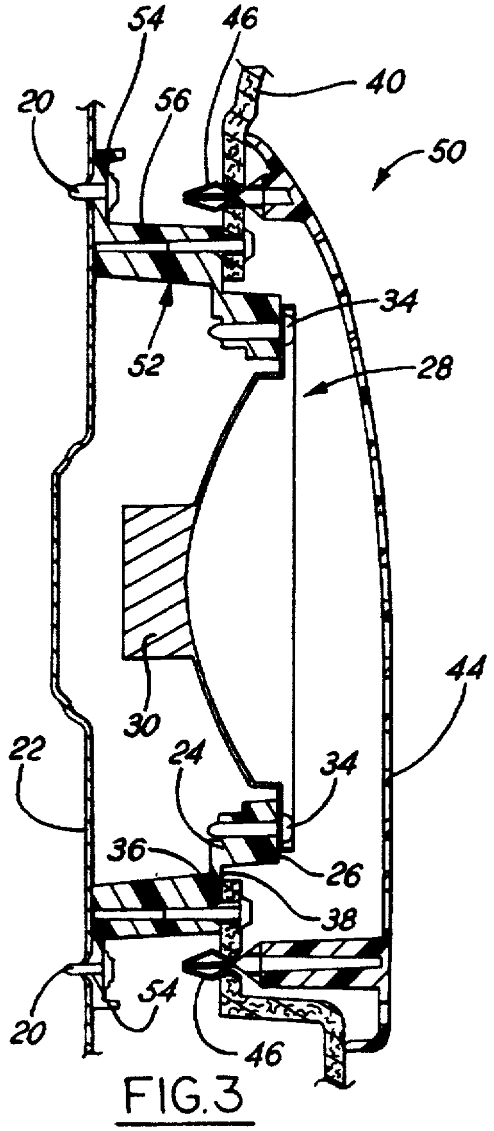
FIG. 3 is a fragmentary sectional view similar to that of FIG. 2 illustrating a modified embodiment of the invention.

FIG. 3 illustrates a modified speaker mounting system 50 that features a bridge bracket 52 constructed in such a way that speaker 28 may be preassembled to the bridge, if desired. That is, the bridge mounting flange or tabs 54 project radially outwardly from the speaker cavity formed by bridge wall 56 in the embodiment of FIG. 3, so as to afford access to bridge mounting screws 20 even if speaker 28 is secured to bridge 52 by speaker mounting screws 34. Otherwise, the mounting arrangement of FIG. 3 is basically the same as in FIG. 2, and identical reference numerals are employed to indicate identical or similar components. The construction of bridges 14,52, particularly the thickened platform and ledge portions, increases their strength and rigidity.

Figure 4:
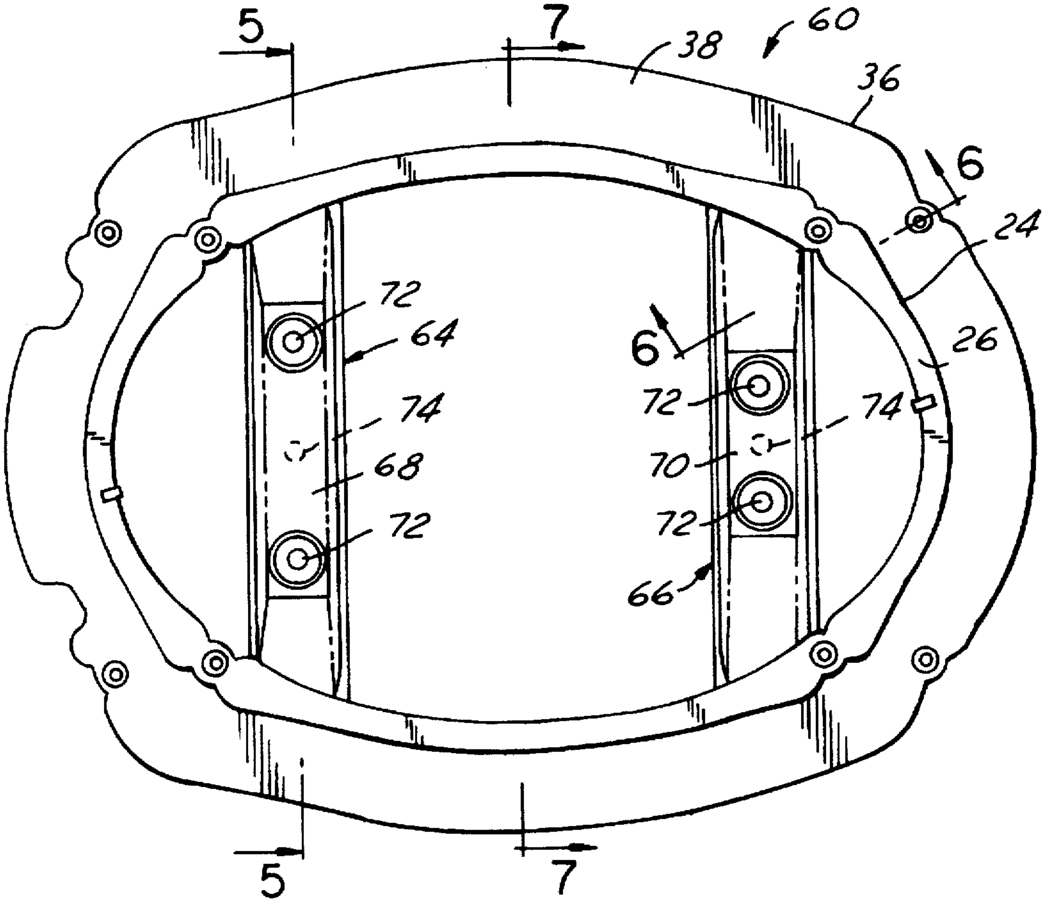
FIG. 4 is an elevational view of a speaker mounting bridge bracket in accordance with a presently preferred embodiment of the invention.
Figure 6:
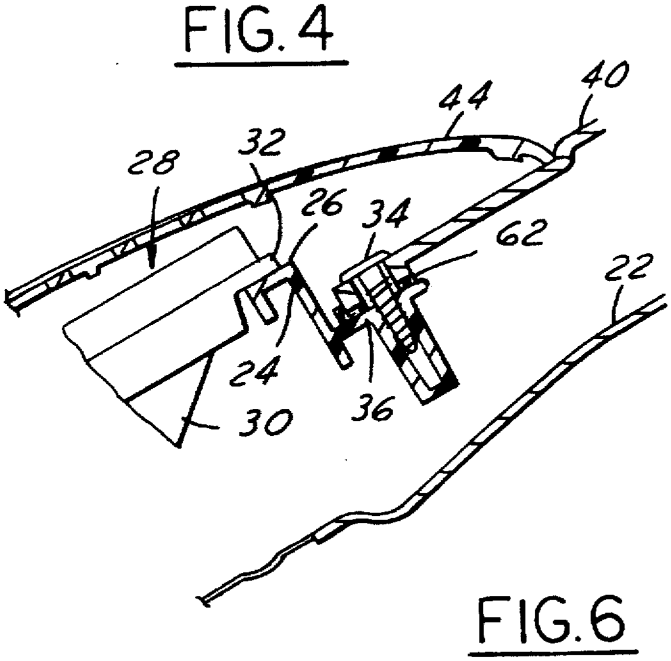
FIGS. 5, 6 and 7 are fragmentary sectional views taken substantially along the respective lines 5—5, 6—6 and 7—7 in FIG. 4, and illustrate the bridge bracket along with the speaker, trim panel, grill and support panel in assembly.
Figure 5:
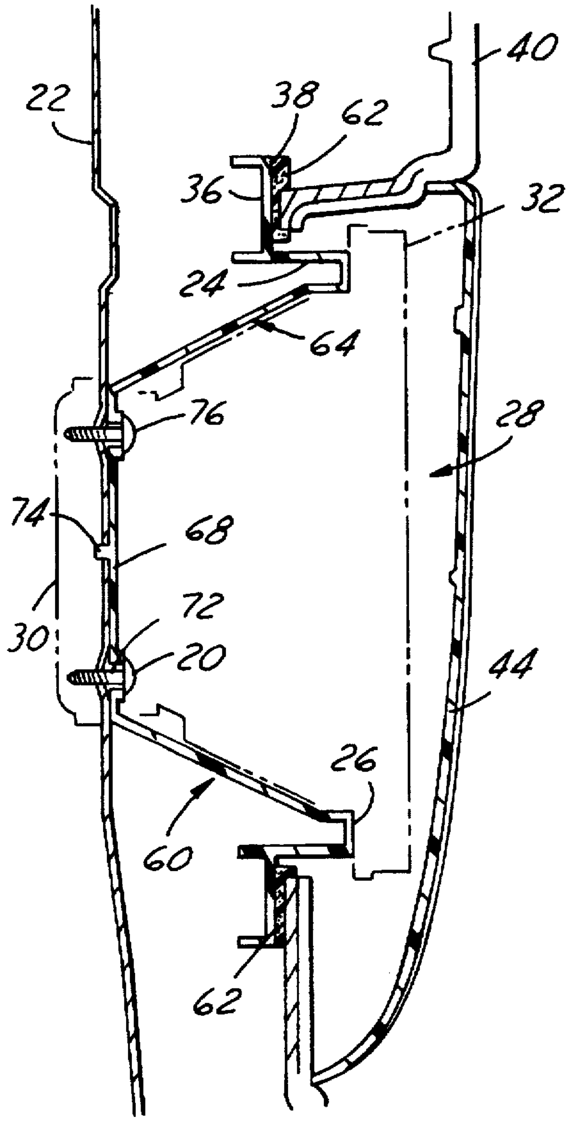
Figure 7:
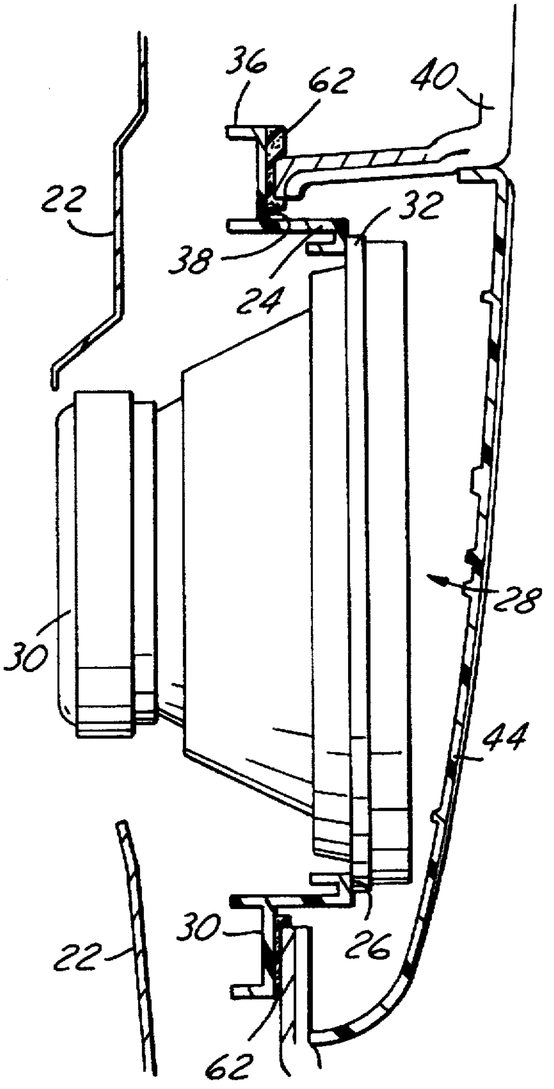

FIGS. 4–7 illustrate a modified embodiment of the invention. In FIGS. 4–6 elements or pans having reference numerals identical to those employed in connection with FIGS. 1–3 perform identical or equivalent functions. A bridge bracket 60 in FIGS. 1–3 has a circumferentially continuous speaker-mounting platform 24 with a flat axially facing surface 26 against which speaker 28 is mounted as in the previous embodiments. A recessed ledge 36 extends radially outwardly from and is axially offset from platform 24 for mounting of trim panel 40, again as in the previous embodiments. A circumferentially continuous strip 62 of foam rubber preferably is placed on ledge 36 prior to assembly of trim panel 40 for enhanced isolation of speaker-enduced vibrations from trim panel 40, and from grill 44 mounted on trim panel 40. A pair of support legs 64 (FIGS. 4 and 5) and 66 (FIG. 4) extend axially inwardly from platform 24 for mounting bridge 60 to interior sheet metal support panel 22. Each leg 64, 66 has a flat portion 68, 70 spaced from the speaker opening and in which a pair of mounting openings 72 are disposed. Between mounting openings 72 in each leg 64, 66, an integral alignment stud 74 (FIGS. 4 and 5) extends inwardly from the bridge leg. Bridge 60 is mounted to interior support panel 22 by sheet metal screws 76 that extend through openings 72 in legs 64, 66 into corresponding openings in support panel 22. The mounting openings in support panel 22 are formed in conical depressions, as best seen in FIG. 5, which facilitate alignment of screws 76 with the openings in the sheet metal support panel and thereby facilitate assembly of bridge 60 to support panel 22. Studs 74 align with corresponding openings in support panel 22, as shown in FIG. 5, to align the bridge with the panel mounting openings, and thereby further to facilitate the assembly operation. Separation between openings 72 differs in each leg to prevent misassembly.

We claim:

1. A system for mounting an audio speaker that comprises:

support means, a bridge mounted on and extending from said support means, said bridge having an integral platform that surrounds an opening spaced from said support means an audio speaker having a body received in said opening, and mounting means radially extending from said body and removably secured to said platform, trim means overlying said support means and removably secured to said bridge radially outwardly of said speaker and independently of said speaker mounting means such that said trim means and said speaker are removable from said bridge independently of each other, and a grill removably secured to said trim means overlying said speaker and said bridge.

2. The system set forth in claim 1 wherein said platform has a raised portion surrounding said opening on which said speaker is secured, and a recessed portion radially outwardly surrounding said raised portion to which said trim means is secured.

3. The system set forth in claim 2 further comprising a layer of sound insulation means disposed between said recessed portion and said trim panel.

4. The system set forth in claim 1 wherein said platform has a first planar surface on which said speaker is secured and a second planar surface on which said trim means is secured, acoustic seals being formed between said speaker and said trim means and said first and second planar surfaces respectively.

5. The system set forth in claim 4 wherein said first and second planar surfaces are at differing elevations from said support means.

6. The system set forth in claim 5 wherein said first and second planar surfaces are parallel to each other.

7. A system for mounting an audio speaker within an automobile door comprising:

a door interior support panel, a bridge mounted on and extending from said interior support panel, said bridge having an integral platform spaced from said support panel and surrounding a speaker opening, an audio speaker having a body received within said speaker opening, and mounting means radially projecting from said body and removably secured to said platform, a door trim panel having a lip that surrounds a speaker opening, said lip being removably secured to said platform radially outwardly of said speaker mounting means such that said trim panel and said speaker are removably secured to said platform independently of each other, and a grill removably secured to said trim panel overlying and enclosing the speaker opening in said trim panel.

8. The system set forth in claim 7 wherein said platform has a first planar surface on which said speaker is secured and a second planar surface on which said trim panel is secured, acoustic seals being formed between said speaker and said trim panel and said first and second planar surfaces respectively.

9. The system set forth in claim 8 wherein said first and second planar surfaces are at differing elevations from said support means.

10. The system set forth in claim 9 wherein said first and second planar surfaces are parallel to each other.

11. The system set forth in claim 10 further comprising a layer of sound insulation means disposed between said recessed portion and said trim panel.

12. A system for mounting an audio speaker that comprises:

support means, a bridge mounted on and extending from said support means, said bridge having an integral platform that surrounds an opening spaced from said support means, said bridge further including support mounting means remote from said platform and extending radially inwardly from said bridge, said bridge being mounted to said support means prior to securement of said speaker to said platform, trim means overlying said support means and removably secured to said bridge radially outwardly of said speaker and independently of said speaker mounting means such that said trim means and said speaker are removable from said bridge independently of each other, and a grill removably secured to said trim means overlying said speaker and said bridge.

13. The system set forth in claim 12 wherein said support mounting means comprises at least one mounting leg extending radially inwardly from said bridge, said leg and said support means having openings for receiving means for fastening said support mounting means to said support means, said openings in said support means being disposed in conical recesses in said support means.

14. The system set forth in claim 13 further comprising a stud on each said mounting leg, and an opening in said support means for receiving each said stud to facilitate alignment of said openings for said fastening means.

15. A system for mounting an audio speaker that comprises:

support means, a bridge mounted on and extending from said support means, said bridge having an integral platform that surrounds an opening spaced from said support means, said bridge further including support mounting means remote from said platform and extending radially outwardly from said bridge, said bridge being mountable to said support means either prior to or after securement of said speaker to said platform, trim means overlying said support means and removably secured to said bridge radially outwardly of said speaker and independently of said speaker mounting means such that said trim means and said speaker are removable from said bridge independently of each other, and a grill removably secured to said trim means overlying said speaker and said bridge.

16. A system for mounting an audio speaker in an automobile door that comprises:

support means comprising an interior door support panel, a bridge mounted on and extending from said support means, said bridge having an integral platform that surrounds an opening spaced from said support means, an audio speaker having a body received in said opening, and mounting means radially extending from said body and removably secured to said platform, a door trim panel overlying said support means and removably secured to said bridge radially outwardly of said speaker and independently of said speaker mounting means such that said trim panel and said speaker are removable from said bridge independently of each other, and a grill removably secured to said trim panel overlying said speaker and said bridge.

* * * * *